United States Patent
Lin et al.

(10) Patent No.: US 10,672,681 B2
(45) Date of Patent: Jun. 2, 2020

(54) SEMICONDUCTOR PACKAGES

(71) Applicant: Taiwan Semiconductor Manufacturing Co., Ltd., Hsinchu (TW)

(72) Inventors: Chien-Chang Lin, New Taipei (TW); Hsin-Yu Pan, Taipei (TW); Lipu Kris Chuang, Hsinchu (TW); Ming-Chang Lu, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/965,989

(22) Filed: Apr. 30, 2018

(65) Prior Publication Data

US 2019/0333836 A1  Oct. 31, 2019

(51) Int. Cl.
| H01L 23/373 | (2006.01) |
| H01L 25/10 | (2006.01) |
| H01L 23/31 | (2006.01) |
| H01L 23/367 | (2006.01) |
| H01L 23/498 | (2006.01) |
| H01L 25/065 | (2006.01) |

(52) U.S. Cl.
CPC ........ *H01L 23/373* (2013.01); *H01L 23/3128* (2013.01); *H01L 23/3157* (2013.01); *H01L 23/367* (2013.01); *H01L 23/49816* (2013.01); *H01L 23/49827* (2013.01); *H01L 25/0655* (2013.01); *H01L 25/105* (2013.01); *H01L 2225/1058* (2013.01); *H01L 2225/1094* (2013.01)

(58) Field of Classification Search
None
See application file for complete search history.

(56) References Cited

U.S. PATENT DOCUMENTS

| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |

(Continued)

*Primary Examiner* — Bilkis Jahan
(74) *Attorney, Agent, or Firm* — JCIPRNET

(57) ABSTRACT

Semiconductor packages are provided. One of the semiconductor packages includes a first sub-package and a second sub-package. The first sub-package includes a first die, a graphite oxide layer on the first die and an encapsulant encapsulating the first die and the graphite oxide layer. The second sub-package is stacked on and electrically connected to the first sub-package, and includes a second die. The graphite oxide layer is disposed between the first die and the second die.

20 Claims, 15 Drawing Sheets

(56) References Cited

U.S. PATENT DOCUMENTS

| | | | |
|---|---|---|---|
| 2015/0028498 A1* | 1/2015 | Ji | C08K 3/042 257/789 |
| 2015/0257258 A1* | 9/2015 | Naito | H01L 33/486 257/99 |
| 2016/0053155 A1* | 2/2016 | Lee | C09K 5/14 428/336 |
| 2018/0075625 A1* | 3/2018 | Li | H01L 33/34 |
| 2019/0237688 A1* | 8/2019 | Shin | H01L 51/56 |
| 2019/0275444 A1* | 9/2019 | Biegelsen | B01D 33/801 |

* cited by examiner

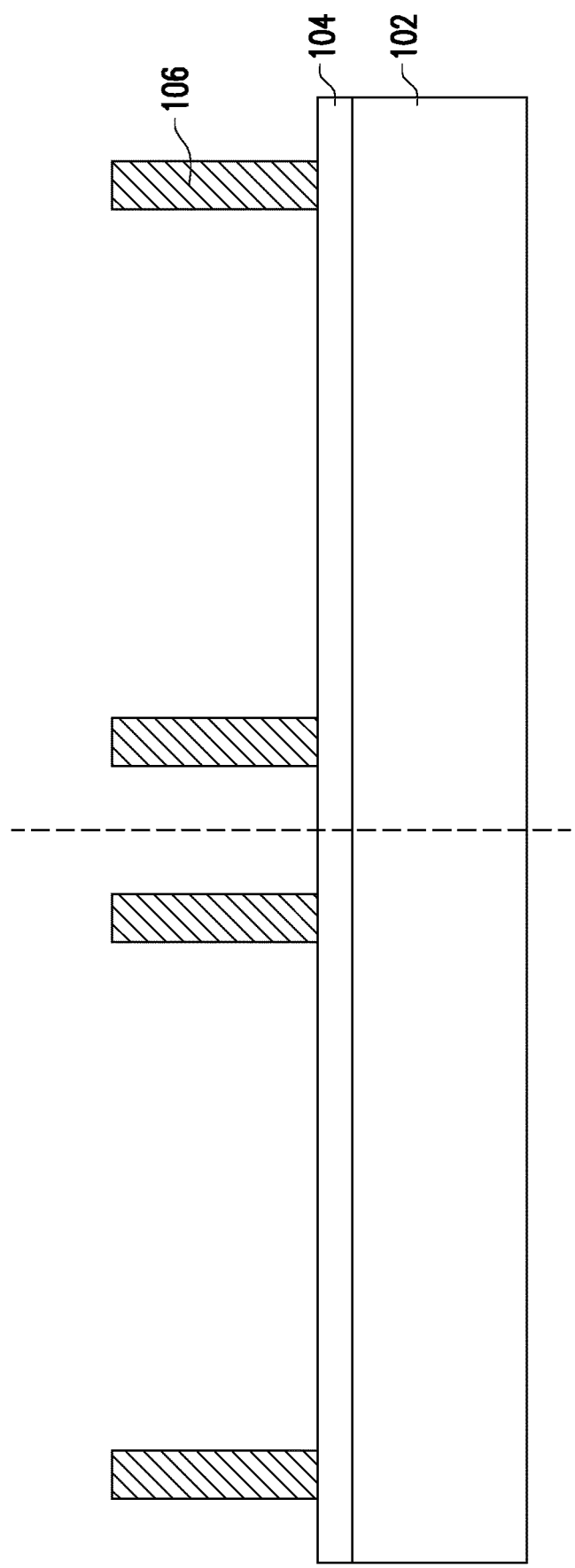

SEMICONDUCTOR PACKAGES

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). Heat dissipation is a challenge in the 3DICs. There exists a bottleneck in efficiently dissipating the heat generated in the inner dies of the 3DICs. The heat generated in the inner dies has to be dissipated to outer components such as outer dies before the heat can be conducted to any heat spreader. Between the stacked dies, however, there exist other materials such as underfill, molding compound, etc, which are not effective in conducting heat. As a result, the heat may be trapped in an inner region of a bottom stacked die and cause a sharp local temperature peak (sometimes referred to as a hot spot). Furthermore, hot spots due to heat generated by devices at the bottom of the stacked dies may also negatively affect the electrical performance of other overlaying devices in the stacked dies as well as the reliability of the whole 3DIC package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1H are schematic cross sectional views of various stages in a method of forming a semiconductor package in accordance with some embodiments.

DETAILED DESCRIPTION

Figure 1B:
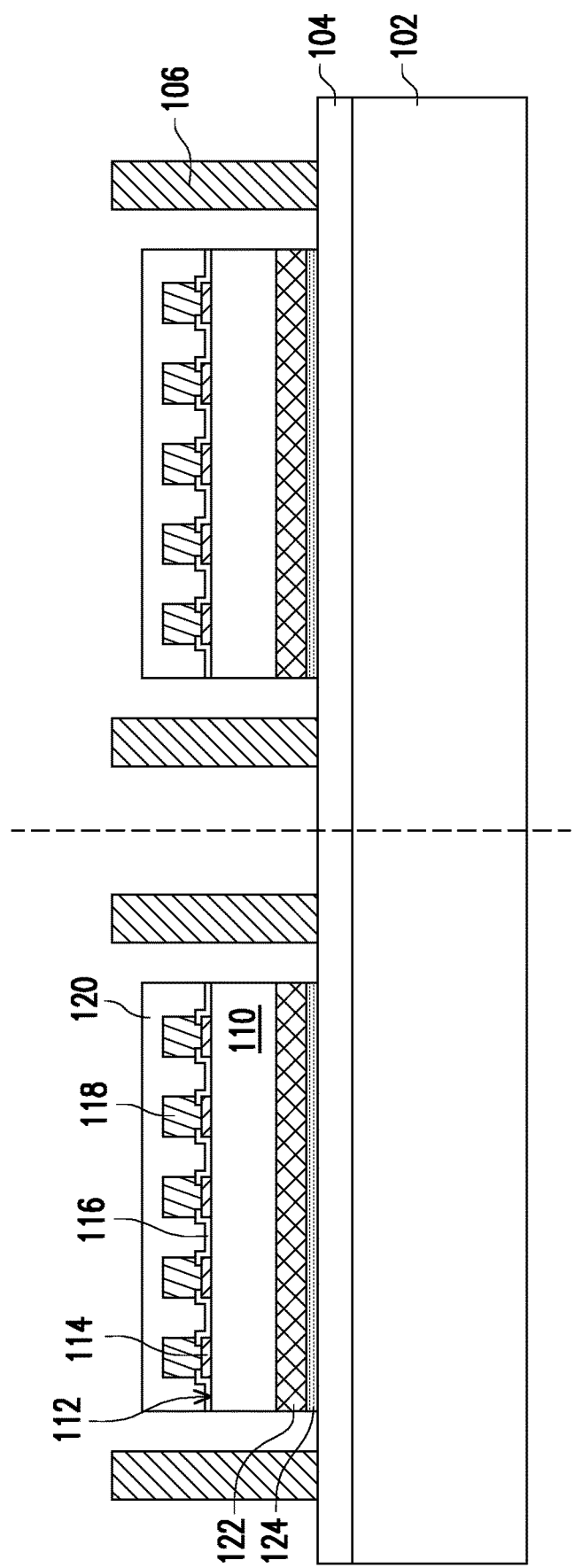

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1H are schematic cross sectional views of various stages in a method of forming a semiconductor package in accordance with some embodiments. In exemplary embodiments, the semiconductor manufacturing method is part of a packaging process. In some embodiments, two chips or dies are shown to represent plural chips or dies of the wafer.

Referring to FIG. 1A, in some embodiments, a carrier 102 with a buffer layer 104 coated thereon is provided, the carrier 102 may be a glass carrier or any suitable carrier for carrying a semiconductor wafer or a reconstituted wafer for the manufacturing method of the semiconductor package. In some embodiments, the buffer layer 104 includes a debond layer and the material of the debond layer may be any material suitable for bonding and debonding the carrier 102 from the above layers or wafer disposed thereon. In some embodiments, the buffer layer 104 includes, for example, a light-to-heat conversion ("LTHC") layer, and such layer enables room temperature debonding from the carrier by applying laser irradiation. In some embodiments, the buffer layer 104 includes a dielectric material layer made of a dielectric material including benzocyclobutene ("BCB"), polybenzooxazole ("PBO"), or any other suitable polymer-based dielectric material. In some embodiments, through interlayer vias (TIVs) 106 are formed on the buffer layer 104 over the carrier 102. In some embodiments, the TIVs 106 are through integrated fan-out ("InFO") vias.

Referring to FIG. 1B, first dies 110 are provided and disposed on the exposed buffer layer 104 on the carrier 102. In some embodiments, the first dies 110 may be digital chips, analog chips or mixed signal chips, such as application-specific integrated circuit ("ASIC") chips, high bandwidth memory (HBM) chips, sensor chips, wireless and radio frequency chips, memory chips, logic chips or voltage regulator chips. In some embodiments, the first die 110 includes an active surface 112, a plurality of pads 114 distributed on the active surface 112, a passivation layer 116 covering the active surface 112, a plurality of vias 118 and a protection layer 120. The pads 114 are partially exposed by the passivation layer 116, the vias 118 are disposed on and electrically connected to the pads 114, and the protection layer 120 covers the vias 118 and the passivation layer 116.

In some embodiments, a graphite oxide layer 122 is formed on a backside of the first die 110 and functions as a heat spreader. In some embodiments, the graphite oxide layer 122 is in direct contact with the first die 110. In some embodiments, the graphite oxide layer 122 is in direct contact with a substrate of the first die 110, for example. In some embodiments, the graphite oxide layer 122 is formed entirely on the backside of the first die 110, for example. A size of the graphite oxide layer 122 may be substantially equal to or smaller than a size of the backside of the first die 110. The graphite oxide layer 122 may be formed by a deposition process, a coating process or other suitable processes, for example. In some embodiments, a graphite oxide solution is spin-coated onto the backside of the first die 110, and then the coated graphite oxide solution is evaporated, to deposit the graphite oxide layer 122 on the first die 110. In some embodiments, the graphite oxide solution may be coated at ambient temperature such as ranging from 15° C. to 35° C. In some embodiments, the graphite oxide layer 122 may further include graphene, graphite or a combination thereof, for example. In some embodiments, a thickness of the graphite oxide layer 122 is less than 10 urn. In some embodiments, a thickness of the graphite oxide layer 122 is about 5 urn, for example. Although the graphite oxide layer 122 is illustrated as a continuous graphite oxide layer extending over the first die 110, in some alternative embodiments, the graphite oxide layer 122 may be physically disconnected.

In some embodiments, a die attach film 124 is further formed on the graphite oxide layer 122 on the first die 110 for better attachment, and the backsides of the first dies 110 are adhered to the carrier 102. In some embodiments, the die attach film 124 is disposed between the graphite oxide layer 122 and the buffer layer 104. In some embodiments, the first dies 110 are placed over the carrier 102 and arranged aside the TIVs 106 (within the area surrounding by the TIVs). In some embodiments, as shown in FIG. 1B, the dotted line represents the cutting line of the whole package in the subsequent cutting process and some of the TIVs 106 are arranged close to but not on the cutting line, and are arranged around the first dies 110.

Figure 1C:
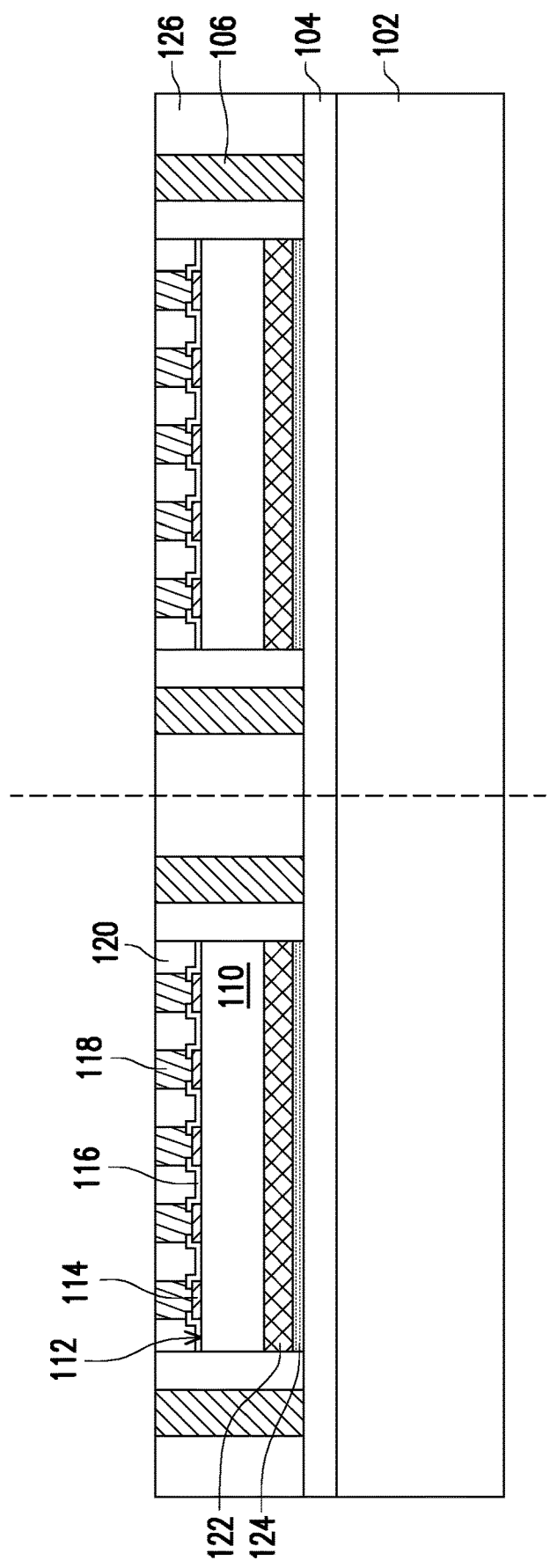

Referring to FIG. 1C, in some embodiments, an encapsulant 126 is formed over the carrier 102, and the first dies 110 on the buffer layer 104 and the TIVs 106 located over the carrier 102 beside the first dies 110 are molded in the encapsulant 126. In some embodiments, the encapsulant 126 covers the buffer layer 104 and fills between the first dies 110 and the TIVs 106. A material of the encapsulant 126 may include a molding compound such as epoxy or other suitable materials. In some embodiments, surfaces of the first dies 110, the TIVs 106 and the encapsulant 126 are substantially coplanar.

Figure 1D:
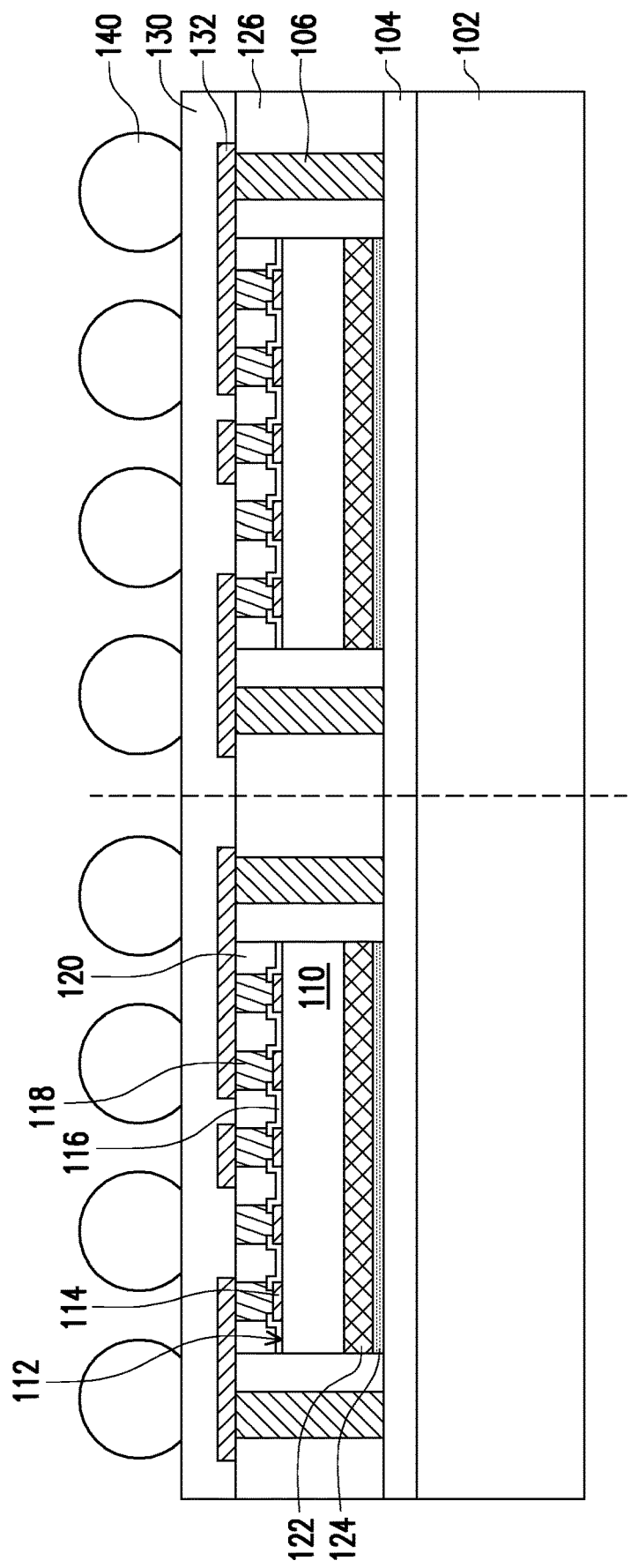

Referring to FIG. 1D, in some embodiments, a redistribution layer 130 is formed on the encapsulant 126, over the vias 118 of the first dies 110 and on the TIVs 106. In some embodiment, the redistribution layer 130 is electrically connected to the TIVs 106 and the vias 118 of the first dies 110. The formation of the redistribution layer 130 includes sequentially forming one or more dielectric material layers and one or more metallization layers in alternation. In certain embodiments, the metallization layer(s) may be sandwiched between the dielectric material layer(s), but at least the bottom metallization layer 132 of the redistribution layer 130 is physically connected to the vias 118 of the first dies 110 and the TIVs 106. In some embodiments, the redistribution layer 130 is a front-side redistribution layer electrically connected to the first dies 110 and is electrically connected to the TIVs 106.

In some embodiments, conductive elements 140 are disposed on the redistribution layer 130 and are electrically connected to the redistribution layer 130. In some embodiments, prior to disposing the conductive elements 140, flux may be applied so that the conductive elements 140 are better fixed to a top metallization layer (not shown) of the redistribution layer, and the top metallization layer may function as contact pads for the conductive elements 140. In some embodiments, the conductive elements 140 are, for example, solder balls or ball grid array ("BGA") balls placed on the redistribution layer 130 and the top metallization layer underlying the conductive elements 140 functions as ball pads. In some embodiments, some of the conductive elements 140 are electrically connected to the first dies 110 through the redistribution layer 130, and some of the conductive elements 140 are electrically connected to the TIVs 106.

Figure 1E:
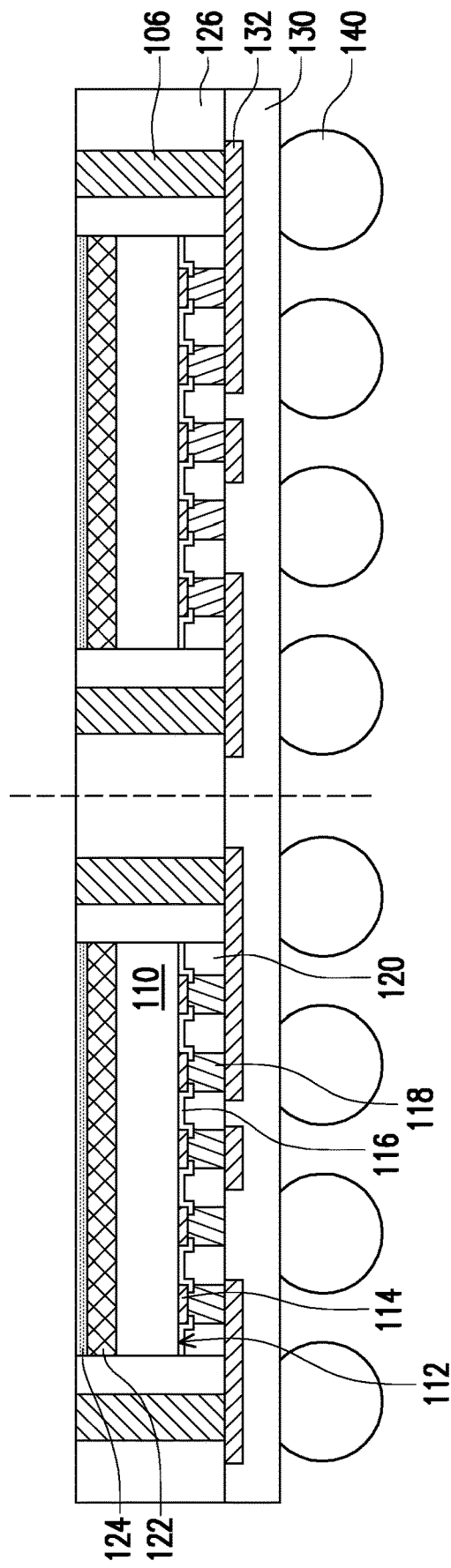

Referring to FIG. 1E, in some embodiments, the whole package is debonded from the carrier 102 to separate the first dies 110 from the carrier 102. In some embodiments, after debonding from the carrier 102, the buffer layer 104 remained on the whole package is removed through an etching process or a cleaning process. Optionally, in later processes, another redistribution layer (not shown) will be formed at the backside of the first die 110 and over the other surface of the encapsulant 126. Alternatively, in one embodiment, the buffer layer 104 may be remained. In some embodiments, the whole package is turned upside down, and the whole package includes a plurality of first sub-packages 100.

Figure 1F:
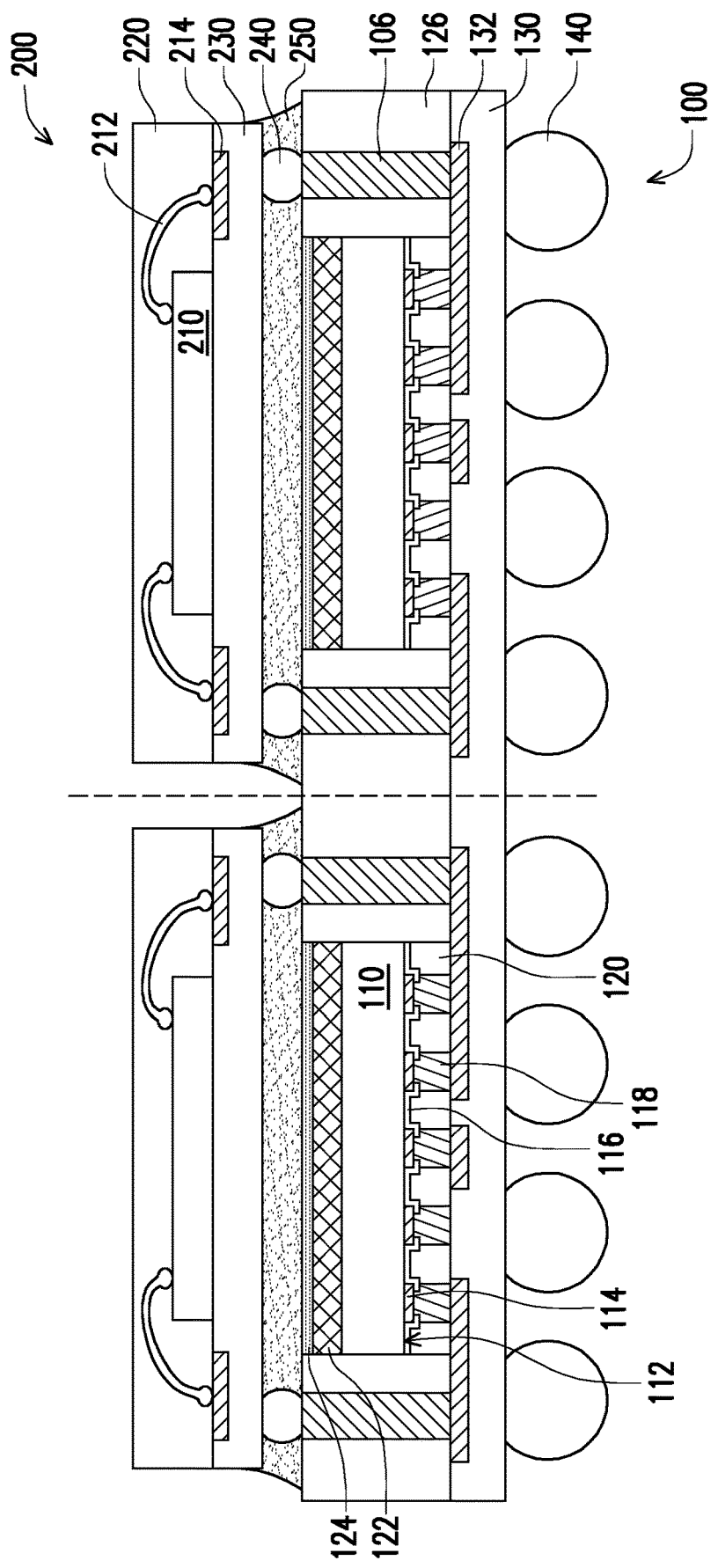

Referring to FIG. 1F, a plurality of second sub-package 200 are stacked on and electrically connected to the first sub-packages 100, respectively. In some embodiments, the second sub-package 200 includes a second die 210, an encapsulant 220, a redistribution layer 230 and a plurality of connectors 240. In some embodiments, the second die 210 is a memory chip such as a dynamic random access memory (DRAM) or any other suitable chip. In some embodiments, the second die 210 is disposed on the redistribution layer 230 and electrically connected to the redistribution layer 230 through bonding wires 212 and pads 214. The second die 210, the bonding wires 212 and the pads 214 are encapsulated by the encapsulant 220 on the redistribution layer 230, for example. The connectors 240 and the second die 210 are disposed on opposite surfaces of the redistribution layer 230. The connectors 240 of the second sub-package 200 are electrically connected with the TIVs 106 of the first sub-package 100. In some embodiments, the second die 210 is electrically connected with the first die 110 and/or the conductive terminals 140 through the redistribution layer 230, the connectors 240, the TIVs 106 and the redistribution layer 130.

In some embodiments, after stacking the second sub-package 200 onto the first sub-package 100, an underfill 250 is respectively filled between the second sub-package 200 and the first sub-package 100 and surrounds the connectors 240. In some embodiments, the underfill 250 is formed on a portion of the outer sidewall of the second sub-package 200.

Figure 1G:
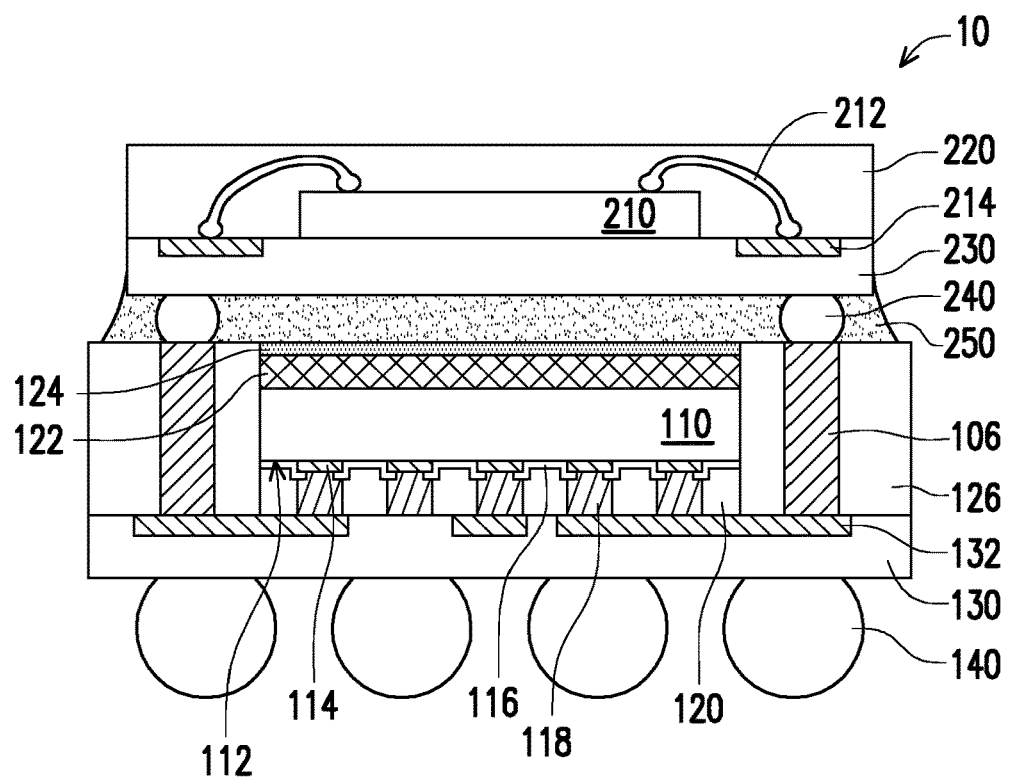

Referring to FIGS. 1F and 1G, in some embodiments, a dicing process is performed to cut the whole package structure (at least cutting though the encapsulant 126 and the redistribution layer 130) along the cutting line (the dotted line) into individual and separated semiconductor packages 10, as shown in FIG. 1G. In one embodiment, the dicing process is a wafer dicing process including mechanical blade sawing or laser cutting.

Figure 1H:
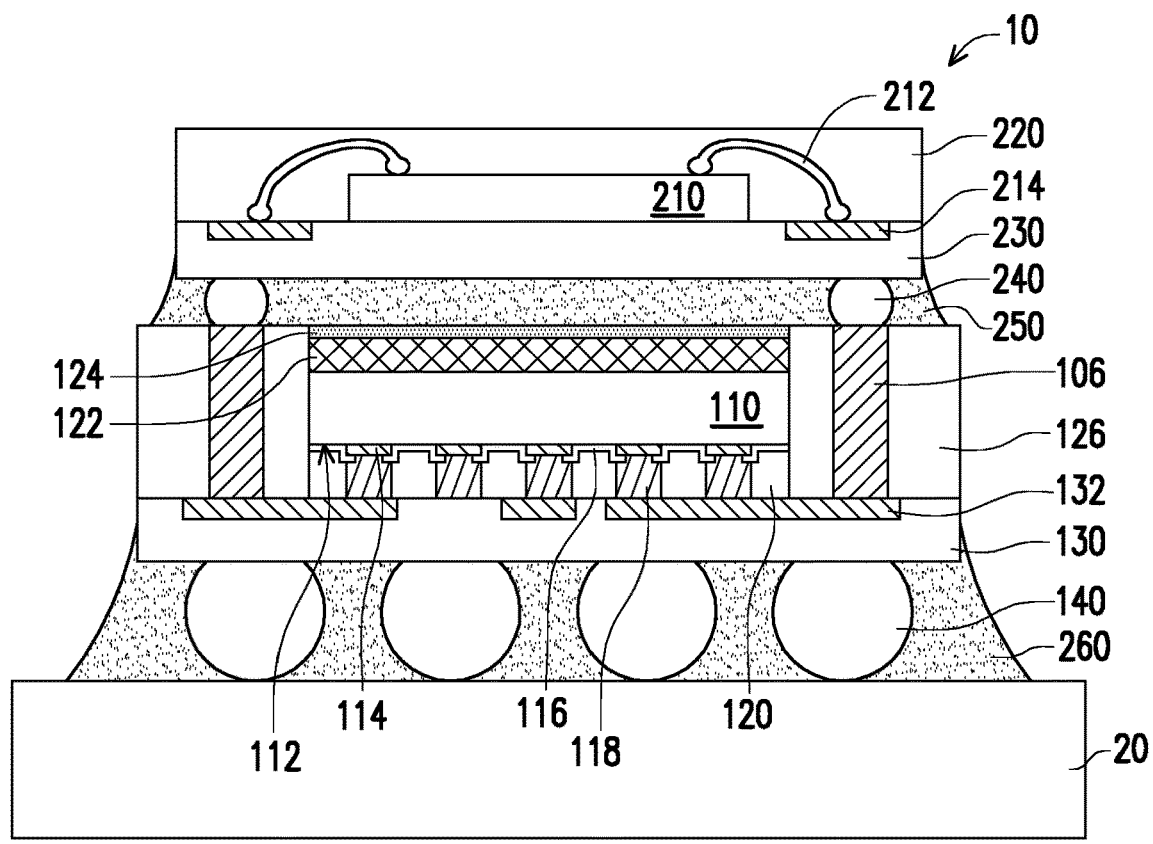

Referring to FIG. 1H, in some embodiments, the semiconductor package 10 is mounted on an electronic device 20. In some embodiments, after mounting the semiconductor package 10 onto the electronic device 20, an underfill 260 is filled between the semiconductor package 10 and the electronic device 20. The underfill 260 is filled between the conductive terminals 140 of the first sub-package 100 and the electronic device 20 and formed on a portion of the outer sidewall of the first sub-package 100. In some embodiments, the electronic device 20 is a board such as a printed circuit board (PCB), for example. In some alternative embodiments, the semiconductor package structure 10 may be mounted with additional packages, chips/dies or other electronic devices.

In some embodiments, the graphite oxide layer is disposed on the first die and functions as a heat spreader for the semiconductor package. Since graphite oxide has a high thermal conductivity (about 1000 W/m·K) and a similar coefficient of thermal expansion with silicon, hot spots in the semiconductor package are mitigated, and the performance and the lifetime of the semiconductor package may be increased. In an experiment, the thermal resistance may be reduced about 50% and the maximum temperature can be significantly reduced when additionally forming the graphite oxide layer on the test sample. In addition, the graphite oxide layer may be formed at a low temperature such as an ambient temperature and by a simple process, and thus the thermal budget and the cost for the semiconductor package would not be significantly increased.

FIG. 2A through FIG. 2F are schematic cross sectional views of various stages in a method of forming a semiconductor package in accordance with some embodiments.

Figure 2A:
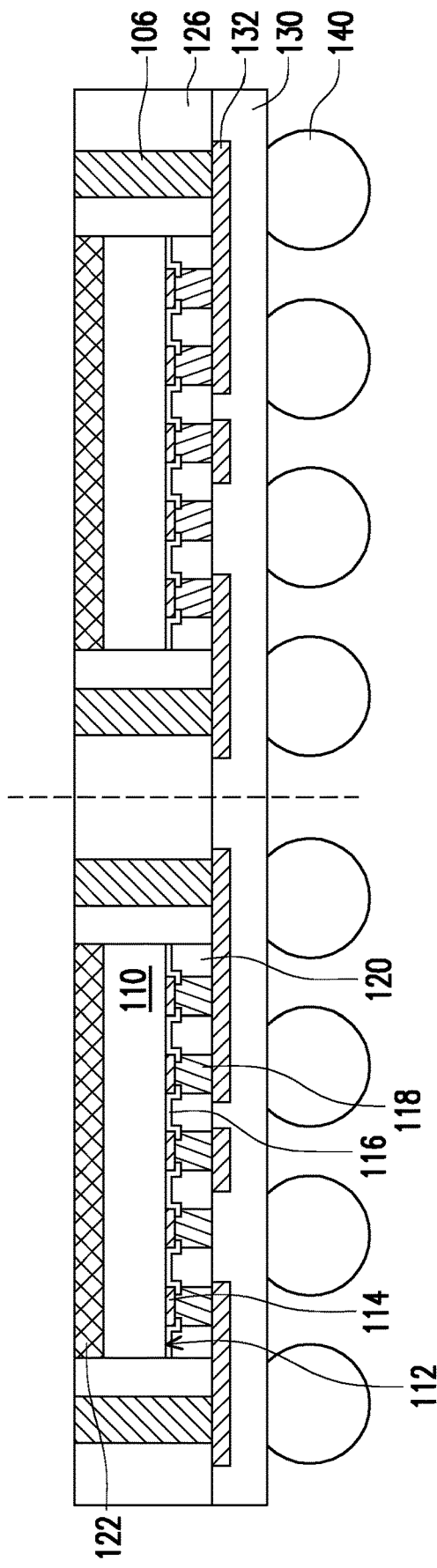
FIG. 2A through FIG. 2F are schematic cross sectional views of various stages in a method of forming a semiconductor package in accordance with some embodiments.

Referring to FIG. 2A, a plurality of first sub-packages 100 are provided. In some embodiments, the first sub-package 100 similar to the first sub-package 100 as shown in FIG. 1E is described, except that a die attach film is fully removed. In some embodiments, surfaces of the graphite oxide layers 122, the TIVs 106 and the encapsulant 126 are substantially coplanar, for example. In some alternative embodiments, the surface of the graphite oxide layers 122 may be slightly lower than the surfaces of the TIVs 106 and the encapsulant 126, for example.

Figure 2B:
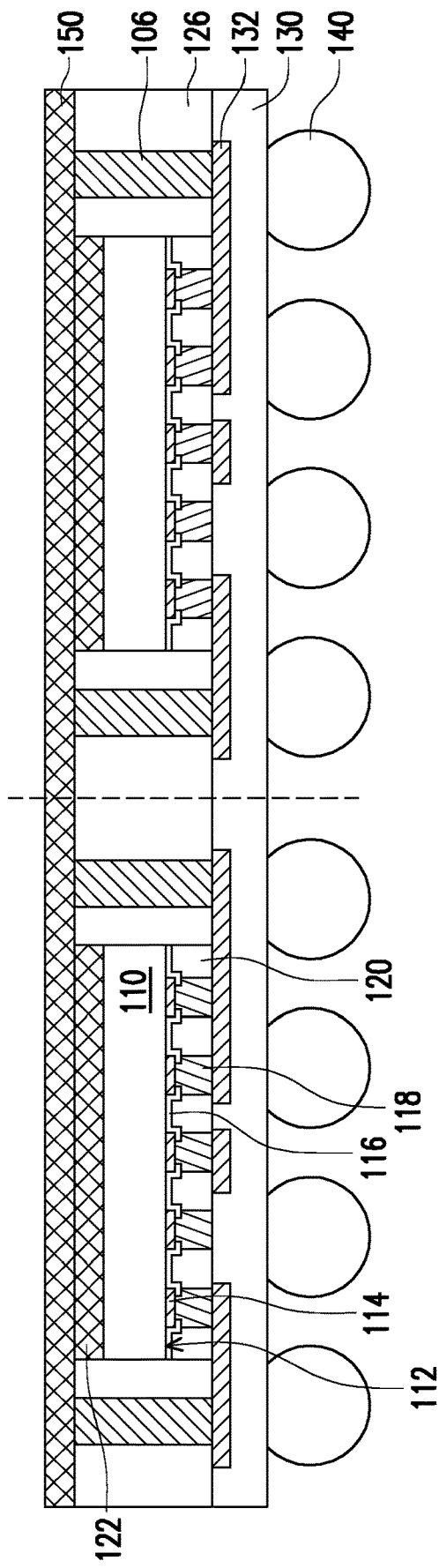

Referring to FIG. 2B, a graphite oxide layer 150 is formed on the first sub-packages 100 and functions as a heat spreader. In some embodiments, the graphite oxide layer 150 is formed on and in direct contact with the graphite oxide layer 122, the TIVs 106 and the encapsulant 126. In some embodiments, the graphite oxide layer 150 may be formed by a deposition process, a coating process or other suitable processes, for example. In some embodiments, a graphite oxide solution is spin-coated onto the surfaces of the graphite oxide layers 122, the TIVs 106 and the encapsulant 126, and then the coated graphite oxide solution is evaporated, to deposit the graphite oxide layer on the first sub-packages 100. In some embodiments, the graphite oxide solution may be coated at ambient temperature such as ranging from 15° C. to 35° C. In some embodiments, the graphite oxide layer 150 may further include graphene, graphite or a combination thereof, for example. In some embodiments, a thickness of the graphite oxide layer 150 is less than 10 um. In some embodiments, a thickness of the graphite oxide layer 150 is about 5 um, for example. Although the graphite oxide layer 150 is illustrated as a continuous graphite oxide layer extending over the first sub-packages 100, in some alternative embodiments, the graphite oxide layer 150 may be physically disconnected.

Figure 2C:
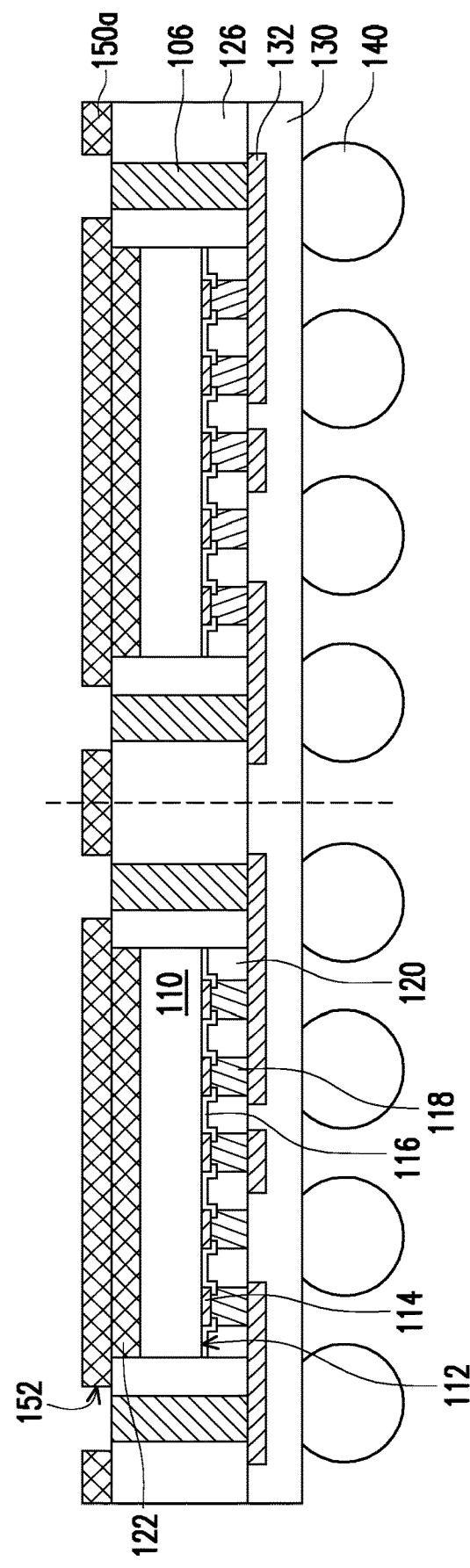

Referring to FIG. 2C, the graphite oxide layer 150 is patterned to form a patterned graphite oxide layer 150a to expose portions of the first sub-packages 100, respectively. In some embodiments, the patterned graphite oxide layer 150a functions as a heat spreader and includes openings 152 to exposes the TIVs 106, for example. In some embodiments, a size of the opening 152 may be smaller or larger than or equal to a size of the TIV 106 as long as a portion of the TIV 106 is exposed by the opening 152. In some embodiments, after forming the graphite oxide layer 150, a photoresist layer is coated on the graphite oxide layer 150 and then patterned. After that, by using the patterned photoresist layer as a mask, portions of the graphite oxide layer 150 are removed to form the patterned graphite oxide layer 150a including the openings 152. In some embodiments, the graphite oxide layer 150 is partially removed by an etching process such as an oxygen plasma etching or other suitable processes, for example.

Figure 2D:
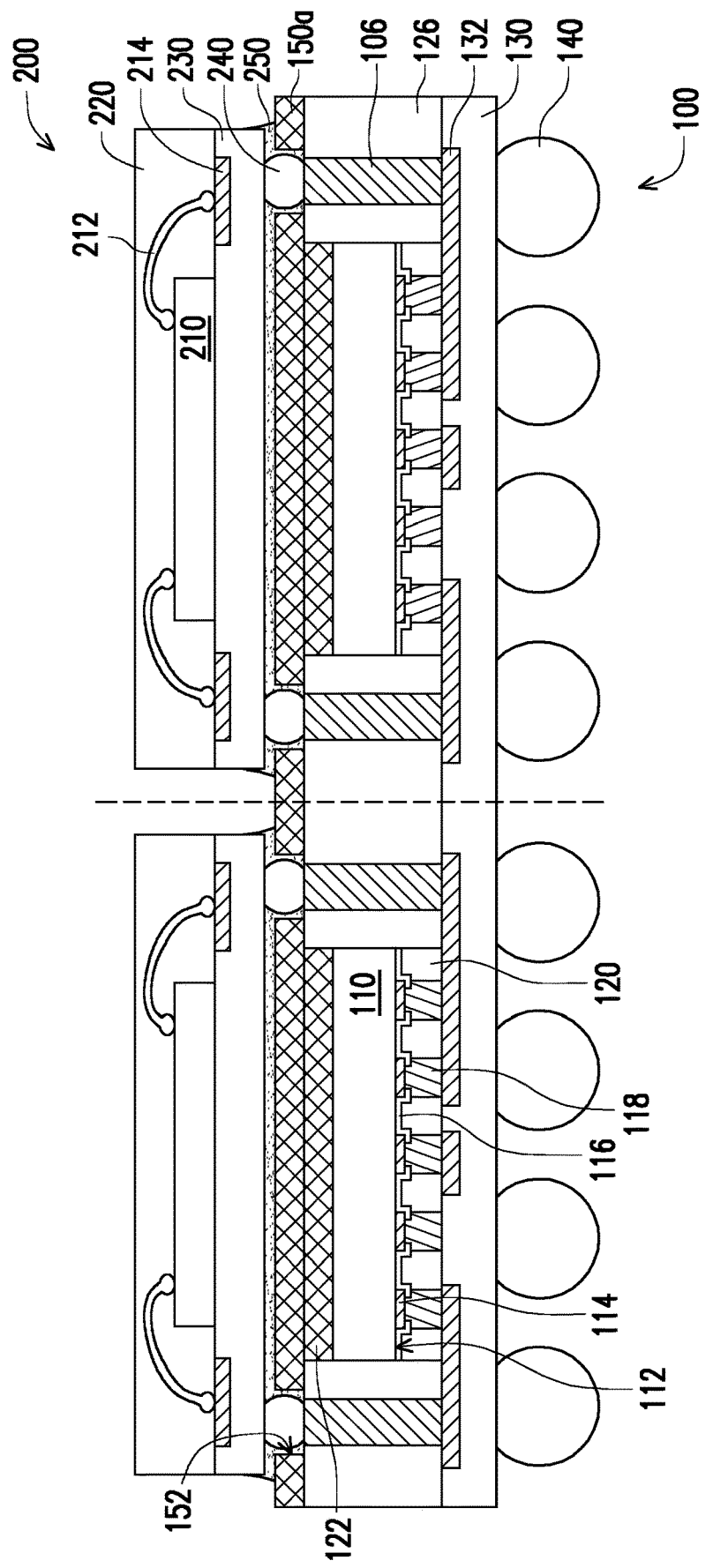

Referring to FIG. 2D, a plurality of second sub-package 200 are stacked on and electrically connected to the first sub-packages 100, respectively. In some embodiments, connectors 240 of the second sub-package 200 are disposed in the openings 152 of the patterned graphite oxide layer 150a, so as to electrically connect the TIVs 106 of the first sub-package 100. In some embodiments, the second sub-package 200 is electrically connected with the first sub-package 100 through the connectors 240 and the TIVs 106. In some embodiments, the second die 210 is electrically connected with the first die 110 and/or the conductive terminals 140 through the redistribution layer 230, the connectors 240, the TIVs 106 and the redistribution layer 130.

In some embodiments, after stacking the second sub-package 200 onto the first sub-package 100, an underfill 250 is respectively filled among the second sub-package 200, the patterned graphite oxide layer 150a and the first sub-package 100. In some embodiments, the underfill 250 is filled between the patterned graphite oxide layer 150a and the redistribution layer 230 of the second sub-package 200. In some embodiments, the underfill 250 is further disposed in the openings 152 of the patterned graphite oxide layer 150a, and between the patterned graphite oxide layer 150a and the connectors 240. In some embodiments, a portion of the patterned graphite oxide layer 150a is exposed by the underfill 250. In some alternative embodiments, the patterned graphite oxide layer 150a may be entirely covered by the underfill 250.

Figure 2E:
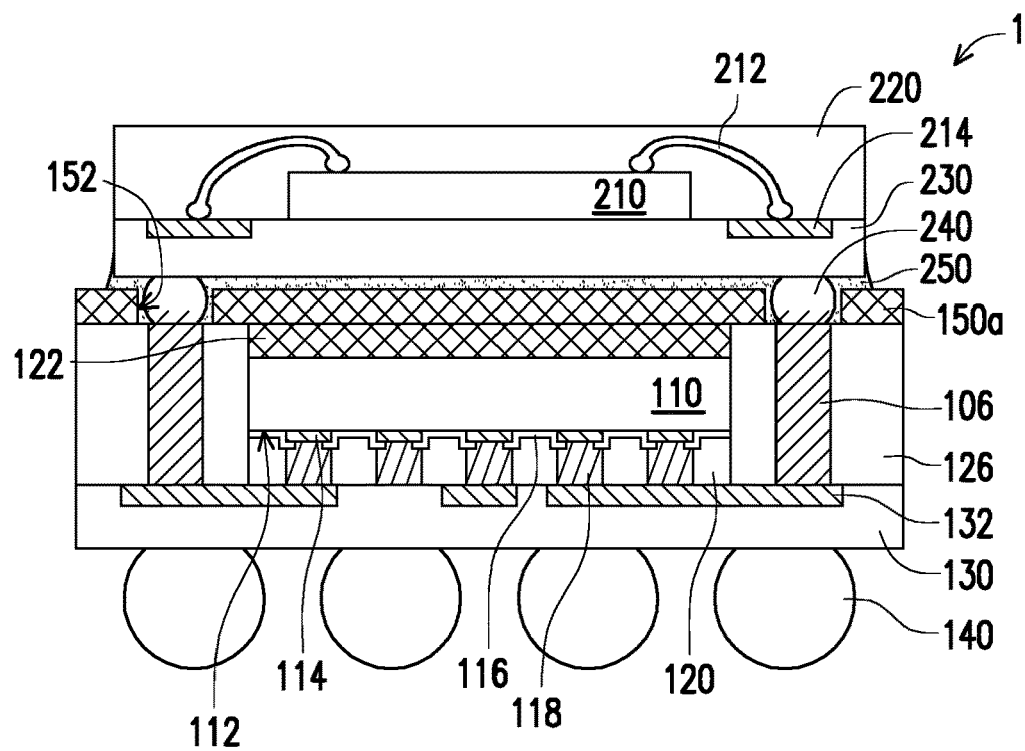

Referring to FIGS. 2D and 2E, in some embodiments, a dicing process is performed to cut the whole package structure (at least cutting though the patterned graphite oxide layer 150a, the encapsulant 126 and the redistribution layer 130) along the cutting line (the dotted line) into individual and separated semiconductor packages 10, as shown in FIG. 2E. In some embodiments, the patterned graphite oxide layer 150a is in direct contact with the graphite oxide layers 122 and the encapsulant 126, for example. In some embodiments, an outer sidewall of the patterned graphite oxide layer 150a is substantially aligned with an outer sidewall of the encapsulant 126, for example.

Figure 2F:
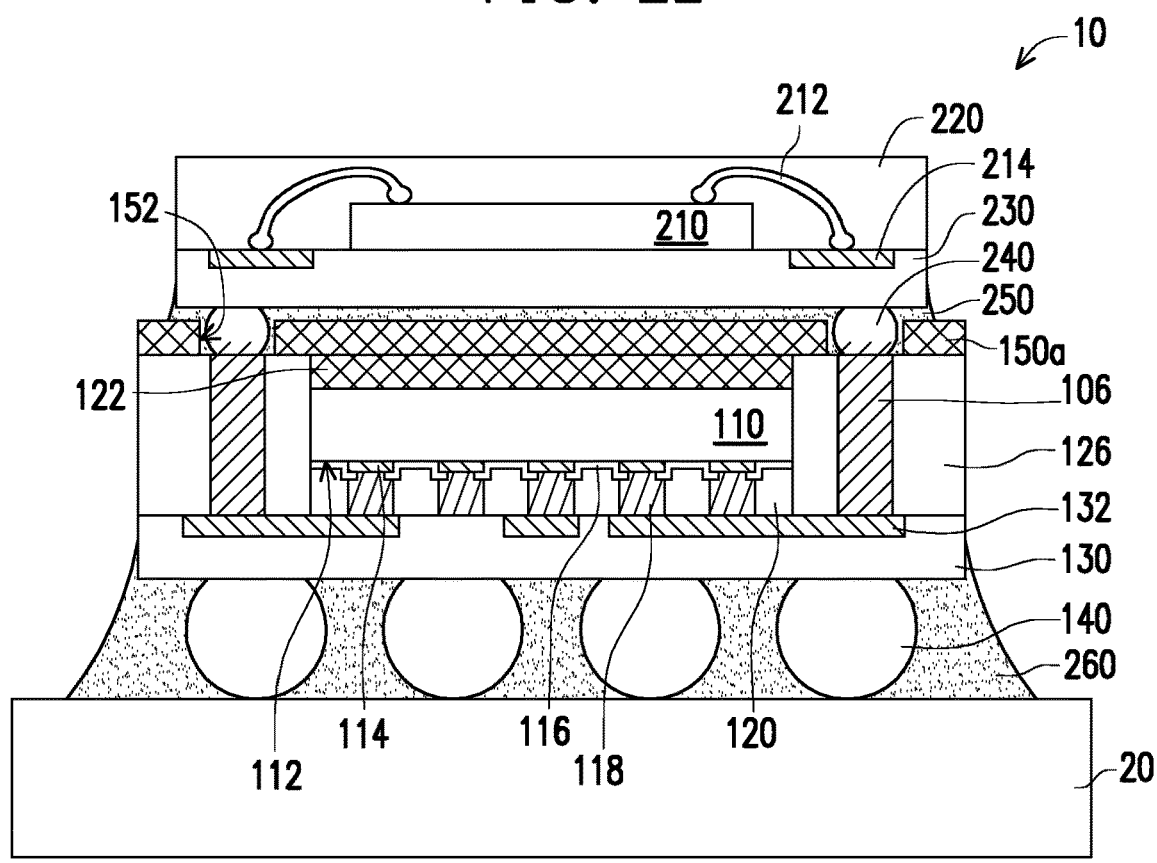

Referring to FIG. 2F, in some embodiments, the semiconductor package 10 is mounted on an electronic device 20. In some embodiments, after mounting the semiconductor package 10 onto the electronic device 20, an underfill 260 is filled between the semiconductor package 10 and the electronic device 20.

In some embodiments, the graphite oxide layer is formed on the backside of the first die, and the patterned graphite oxide layer is further formed on the graphite oxide layer between the first sub-package and the second sub-package. The graphite oxide layer and the patterned graphite oxide layer both function as heat spreaders for the semiconductor package, and thus hot spots in the semiconductor package are mitigated, and the performance and the lifetime of the semiconductor package may be increased. In addition, in some embodiments, the patterned graphite oxide layer is partially exposed by the underfill, and thus the heat spreading function is further increased.

Figure 3:
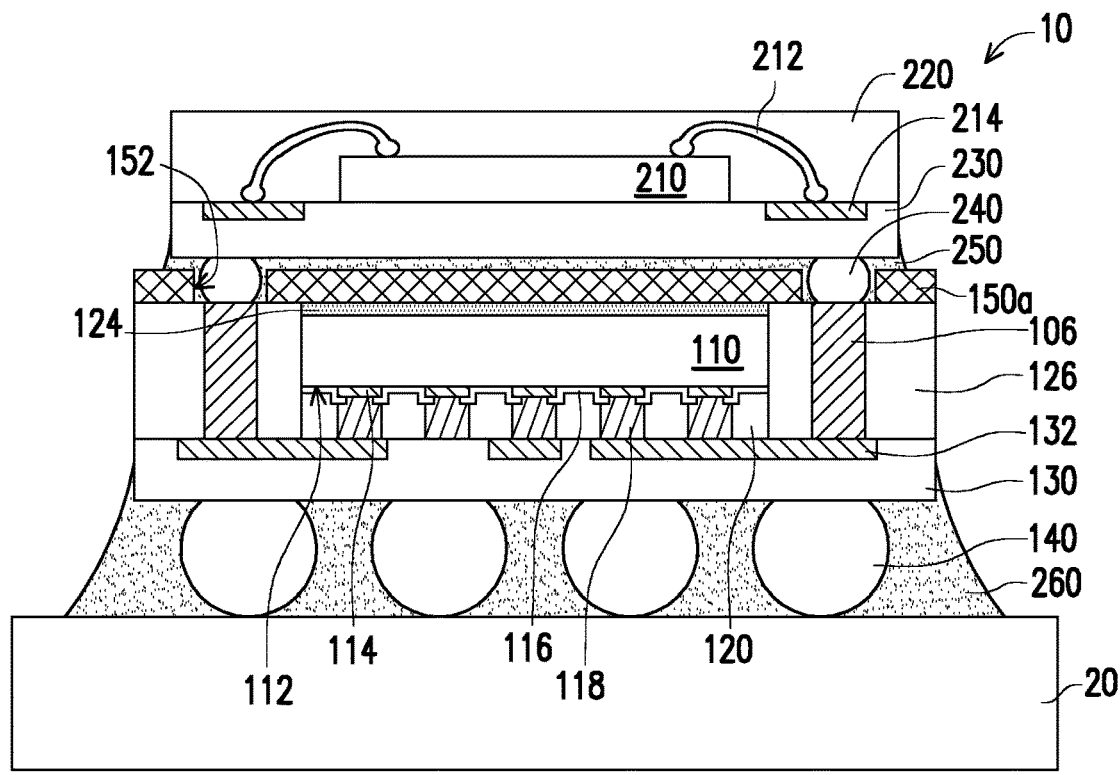
FIG. 3 is a schematic cross sectional view illustrating a semiconductor package in accordance with some embodiments.

FIG. 3 is a schematic cross sectional view illustrating a semiconductor package in accordance with some embodiments. In FIG. 3, a semiconductor package 10 similar to the structure as shown in FIG. 2F is described, except that a DAF is retained on the first die and the graphite oxide layer is not formed on the first die before placing the first die onto the carrier. Referring to FIG. 3, in some embodiments, the semiconductor package 10 includes a first sub-package 100, a second sub-package 200 on the first sub-package 100 and a patterned graphite oxide layer 150a disposed between the first sub-package 100 and the second sub-package 200 and serving as a heat spreader. In some embodiments, after a first die 110 is debonded from the carrier, a DAF 122 is retained on the first die 110. Then, the patterned graphite oxide layer 150a is formed on an encapsulant 126 and the DAF 122 of the first sub-package 100 to expose TIVs 106. In some embodiments, the DAF 122 is disposed between the first die 110 and the patterned graphite oxide layer 150a. After that, the second sub-package 200 is stacked on the patterned graphite oxide layer 150a over the first sub-package 100. In some embodiments, the patterned graphite oxide layer 150a is in direct contact with the DAF 122 and the encapsulant 126, and the DAF 122 is in direct contact with the first die 110, for example.

Figure 4:
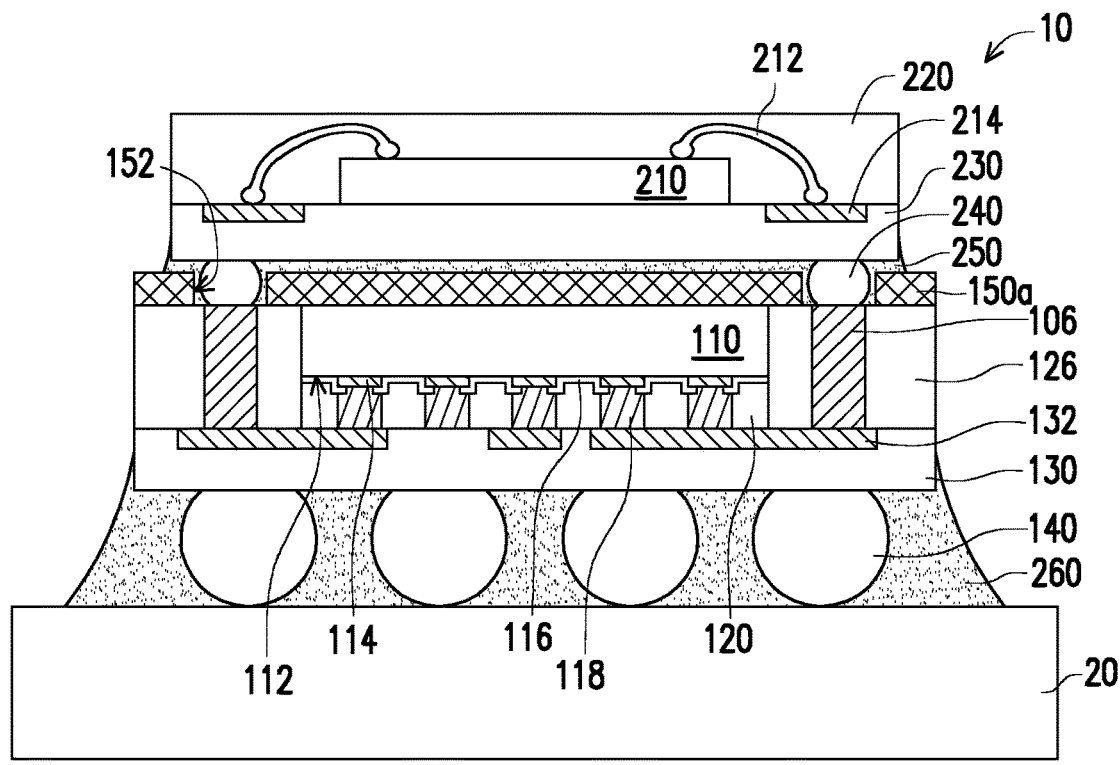
FIG. 4 is a schematic cross sectional view illustrating a semiconductor package in accordance with some embodiments.

FIG. 4 is a schematic cross sectional view illustrating a semiconductor package in accordance with some embodiments. In FIG. 4, a semiconductor package 10 similar to the structure as shown in FIG. 2F is described, except that the graphite oxide layer is not formed on the first die before placing the first die onto the carrier. Referring to FIG. 4, in some embodiments, the semiconductor package 10 includes a first sub-package 100, a second sub-package 200 on the first sub-package 100 and a patterned graphite oxide layer 150a disposed between the first sub-package 100 and the second sub-package 200 and serving as a heat spreader. In some embodiments, after a first die 110 is debonded from the carrier, a DAF (not shown) is fully removed from the first die 110. Then, the patterned graphite oxide layer 150a is formed on an encapsulant 126 and the first die 110 of the first sub-package 100 to expose TIVs 106. After that, the second sub-package 200 is stacked on the patterned graphite oxide layer 150a over the first sub-package 100. In some embodiments, the patterned graphite oxide layer 150a is in direct contact with the first die 110 and the encapsulant 126.

In above embodiments, graphite oxide is used as a heat spreader for the 3DIC package such as package on package (PoP) devices, but the disclosure is not limited. In some embodiments, graphite oxide may be used as a heat spreader in other devices such as high performance computing applications.

Figure 5:
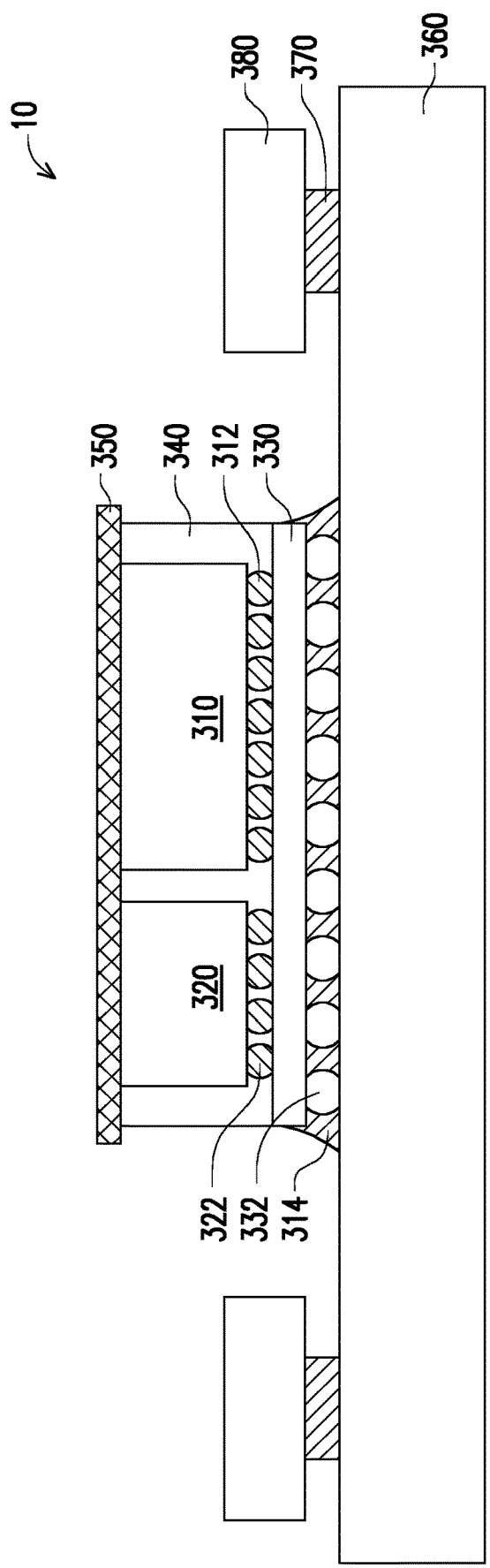
FIG. 5 is a schematic cross sectional view illustrating a semiconductor package in accordance with some embodiments.

FIG. 5 is a schematic cross sectional view illustrating a semiconductor package in accordance with some embodiments. Referring to FIG. 5, a semiconductor package 10 includes a first die 310, a second die 320, an encapsulant 340, a graphite oxide layer 350 and a substrate 360. In some embodiments, the first die 310 and the second die 320 are disposed side by side on the substrate 360, and encapsulated by the encapsulant 340. The first die 310 is a high-power consuming die or die stack, and the second die 320 is a low-power consuming die or stacks. The first die 310 is a high-power consuming die and may consume a relatively high amount of power, and hence generate a relatively large amount of heat, compared to the second die 320 which is a low-power consuming die. For example, high-power consuming die may consume between about 50 W and about 100 W of power whereas low-power consuming die may consume between about 5 W and about 10 W of power.

In some embodiments, the first die 310 may be a single system on chip (SoC) die, multiple SoC stacked dies, or the like. In some embodiments, the second die 320 may be HBM (high bandwidth memory) and/or HMC (high memory cube) modules, which may include memory dies bonded to a logic die. In some alternative embodiments, the first die 310 and the second die 320 may be other chips having other functions. While FIG. 5 illustrates a CoW package having one high-power die and one low-power die, other embodiments may include any number of high-power dies and/or low-power dies.

In some embodiments, the first die 310 and the second die 320 are bonded to a top surface of a package component 330 through a plurality of connectors 312, 322, which may be microbumps. In some embodiments, the package component 330 may be an interposer, which may be a wafer having interconnect structures for electrically connecting active devices (not shown) in the first die 310 and the second die 320 to form functional circuits. The package component 330 may include metallization layers (not shown), through-substrate vias (not shown) and connectors 332, and the TSV may electrically connect the metallization layer to the connector 332 on a backside of the interposer 330. In some alternative embodiments, the package component 330 may be a substrate, a printed circuit board (PCB), or the like. In some alternative embodiments, the package component 330 may be a redistribution layer, and the formed semiconductor package 10 may be an integrated fan-out ("InFO") package.

In some embodiments, the chip-on-wafer (CoW) package is bonded to the substrate 360 using the connectors 322. Thus, a chip-on-wafer-on-substrate (CoWoS) package 10 is formed. The substrate 360 may be any suitable package substrate, such as a printed circuit board (PCB), an organic substrate, a ceramic substrate, a motherboard, or the like. The substrate 360 may be used to interconnect CoW package with other packages/devices to form functional circuits. In some alternative embodiments, the substrate 360 may further include contacts (e.g., ball grid array (BGA) balls) disposed on a surface opposite to the CoW package and used to connect to a motherboard (not shown) or another device component of an electrical system. An underfill 334 may be dispensed between CoW package and the substrate 360.

In some embodiments, the graphite oxide layer 350 covers the exposed top surfaces of the first die 310 and the second die 320 and functions as a heat spreader. Although the graphite oxide layer 350 is illustrated as a continuous graphite oxide layer extending over the first die 310 and the second die 320, in some alternative embodiments, the graphite oxide layer 350 may be physically disconnected. For example, air gaps may be disposed in the graphite oxide layer 350 between adjacent dies (e.g., the first die 310 and the second die 320) to further reduce lateral thermal interaction between dies. In some embodiments, a sidewall of the graphite oxide layer 350 is substantially aligned with a sidewall of the encapsulant 340. Other features of the graphite oxide layer 350 are similar to those describe above and thus are omitted herein.

In some embodiments, an adhesive 370 (e.g., an epoxy, silicon resin, or the like) is dispensed over an otherwise unoccupied portion of the substrate 360. The adhesive 370 may have a better adhering ability and a lower thermal conductivity than the graphite oxide layer 350. The adhesive 370 may be positioned so as to allow a heat dissipating feature 380 (e.g., a contour ring) to be attached around CoW package. Thus, in some embodiments, the adhesive 370 may be disposed around the perimeter of, or even encircle, CoW package.

In some alternative embodiments, the first die 310 and the second die 320 may be both high-power consuming dies or die stacks, and the package component 330 may be a redistribution layer. Accordingly, the formed semiconductor package 10 may be an integrated fan-out ("InFO") package.

Figure 6:
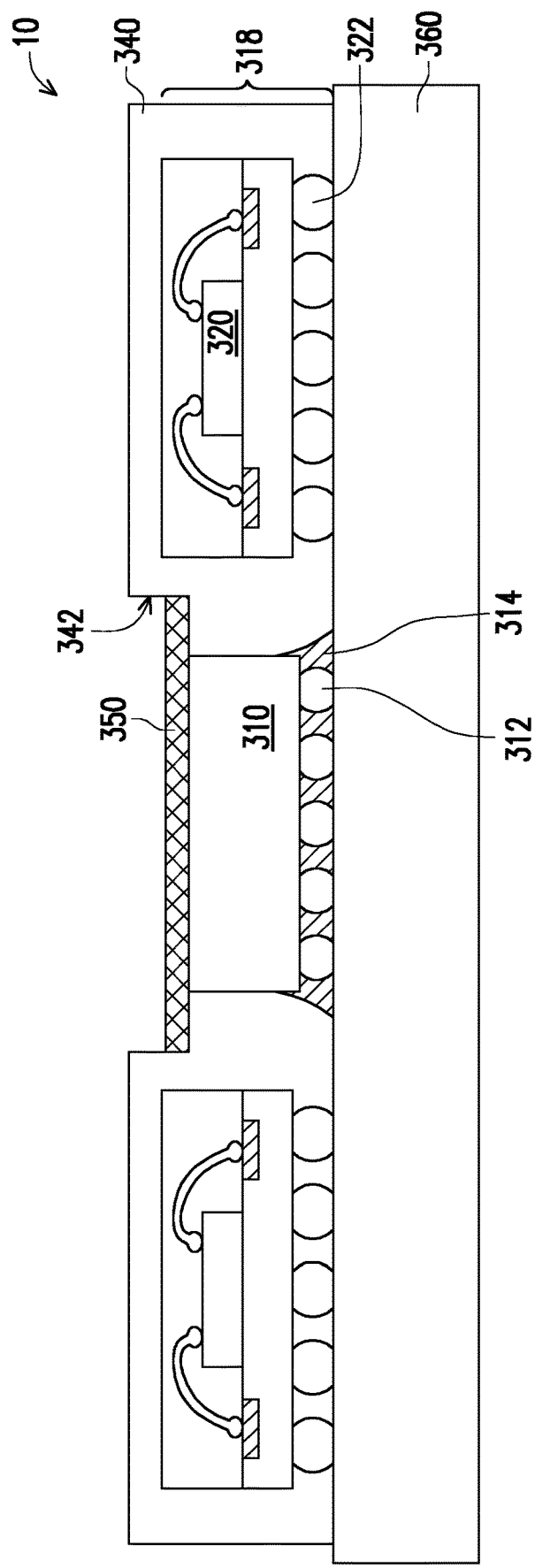
FIG. 6 is a schematic cross sectional view illustrating a semiconductor package in accordance with some embodiments.

FIG. 6 is a schematic cross sectional view illustrating a semiconductor package in accordance with some embodiments. Referring to FIG. 6, a semiconductor package 10 includes a first die 310, second dies 320, an encapsulant 340, a graphite oxide layer 350 and a substrate 360. In some embodiments, the first die 310 is a high-power consuming die or die stack. The second die 320 is a low-power consuming die or stacks. In some embodiments, the first die 310 may be a single system on chip (SoC) die, and the second dies 320 may be memory chips such as DRAM chips, for example. A sub-package 318 including the second die 320 is similar to the second sub-package 200 as shown in FIG. 2F. While FIG. 6 illustrates the semiconductor package 10 having one first die 310 and two second dies 320, other embodiments may include any number of first dies 310 and second dies 320.

The first die 310 and the second dies (the second sub-packages) 320 are disposed side by side on the substrate 360. The first die 310 is electrically connected to the substrate 360 through connectors 312, and an underfill 314 may be dispensed between the first die 310 and the substrate 360. The second dies (the second sub-packages) 320 are electrically connected to the substrate 360 through connectors 322. and encapsulated by the encapsulant 340. In some embodiments, top surfaces of the second dies (the second sub-packages) 320 are covered by the encapsulant 340 while a top surface of the first die 310 is exposed. In some embodiments, an encapsulating material (not shown) is formed to encapsulate the top surfaces of the second dies (the second sub-packages) 320 and the first die 310, and then a portion of the molding material is removed to form the encapsulant 340 having an indentation 342 disposed above the first die 310 and exposing the top surface of the first die 310.

In some embodiments, the graphite oxide layer 350 is disposed in the indentation 342 on the top surface of the first die 310. In some embodiments, a top surface of the graphite oxide layer 350 is lower than a top surface of the encapsulant 340 above the second dies 320. In other words, the indentation 342 is not filled by the graphite oxide layer 350. However, the disclosure is not limited thereto.

Generally, hot spots due to heat generated by high-power consuming dies may cause thermal crosstalk problems for surrounding dies, negatively affecting the surrounding dies' performance and the reliability of the whole 3DIC package. In some embodiments, by using the graphite oxide layer as a heat spreader, the lateral heat dissipation and thermal crosstalk may be reduced, and the performance and the lifetime of the 3DIC package may be increased.

According to some embodiments, a semiconductor package includes a first sub-package and a second sub-package. The first sub-package includes a first die, a graphite oxide layer on the first die and an encapsulant encapsulating the first die and the graphite oxide layer. The second sub-package is stacked on and electrically connected to the first sub-package, and includes a second die. The graphite oxide layer is disposed between the first die and the second die.

According to some embodiments, a semiconductor package includes a first sub-package, a second sub-package and a patterned graphite oxide layer. The first sub-package includes a first die and an encapsulant encapsulating the first die. The second sub-package is stacked on and electrically connected to the first sub-package, and includes a second die. The patterned graphite oxide layer is disposed on the encapsulant of the first sub-package and between the first sub-package and the second sub-package.

According to some embodiments, a semiconductor package includes a substrate, a plurality of dies, an encapsulant and a graphite oxide layer. The dies are disposed side by side on the substrate. The encapsulant encapsulates the plurality of dies on the substrate, wherein a top surface of at least one of the plurality of dies is exposed. The graphite oxide layer covers the top surface of the at least one of the plurality of dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first sub-package, comprising a first die, a graphite oxide layer on the first die and an encapsulant encapsulating the first die and the graphite oxide layer;
   a second sub-package, stacked on and electrically connected to the first sub-package, and comprising a second die, wherein the graphite oxide layer is disposed between the first die and the second die, a material of the encapsulant is different from a material of the graphite oxide layer, and the encapsulant and the graphite oxide layer are two different layers; and
   a patterned graphite oxide layer, disposed between the graphite oxide layer and the second sub-package and in direct contact with the graphite oxide layer.

2. The semiconductor package as claimed in claim 1, wherein the graphite oxide layer is in direct contact with the first die.

3. The semiconductor package as claimed in claim 1, wherein a sidewall of the graphite oxide layer is substantially aligned with a sidewall of the first die.

4. The semiconductor package as claimed in claim 1, wherein the first sub-package further comprises a die attach film, and the graphite oxide layer is disposed between the first die and the die attach film.

5. The semiconductor package as claimed in claim 1, further comprising an underfill between the first sub-package and the second second sub-package and between the patterned graphite oxide layer and the second sub-package.

6. The semiconductor package as claimed in claim 1, wherein a bottom surface of the patterned graphite oxide layer and a top surface of the graphite oxide layer are substantially coplanar with a top surface of the encapsulant.

7. The semiconductor package as claimed in claim 1, wherein a sidewall of the graphite oxide layer is substantially flush with a sidewall of the first die.

8. A semiconductor package, comprising:
a first sub-package, comprising a first die and a first encapsulant encapsulating the first die;
a second sub-package, stacked on and electrically connected to the first sub-package, and comprising a second die and a second encapsulant encapsulating the second die;
a patterned graphite oxide layer, disposed on the first encapsulant of the first sub-package and between the first sub-package and the second sub-package, wherein a material of the first encapsulant is different from a material of the patterned graphite oxide layer, and the first encapsulant and the patterned graphite oxide layer are two different layers; and
an underfill, partially encapsulating the second sub-package and in physical contact with the patterned graphite oxide layer.

9. The semiconductor package as claimed in claim 8, wherein the first sub-package further comprises through interlayer vias electrically connected to the first die and exposed by the patterned graphite oxide layer.

10. The semiconductor package as claimed in claim 8, wherein the second sub-package further comprises connectors electrically connected to the second die and disposed in the patterned graphite oxide layer.

11. The semiconductor package as claimed in claim 10, wherein the second sub-package further comprises a redistribution layer between the second die and the patterned graphite oxide layer, and the second die and the connectors are disposed on opposite surfaces of the redistribution layer.

12. The semiconductor package as claimed in claim 8, wherein the patterned graphite oxide layer is in direct contact with the first die.

13. The semiconductor package as claimed in claim 8, wherein the first sub-package further comprises a die attach film between the first die and the patterned graphite oxide layer.

14. The semiconductor package as claimed in claim 8, wherein the second sub-package further comprises connectors electrically connected to the second die and disposed in the patterned graphite oxide layer.

15. The semiconductor package as claimed in claim 14, wherein the underfill is filled in gaps between the patterned graphite oxide layer and the connectors.

16. The semiconductor package as claimed in claim 8, wherein a bottom surface of the patterned graphite oxide layer is substantially coplanar with a top surface of the first encapsulant.

17. A semiconductor package, comprising:
a substrate;
a plurality of dies, disposed side by side on the substrate;
an encapsulant, encapsulating the plurality of dies on the substrate, wherein a top surface of at least one of the plurality of dies is exposed; and
a graphite oxide layer, covering the top surface of the at least one of the plurality of dies, wherein a material of the encapsulant is different from a material of the graphite oxide layer, the encapsulant and the graphite oxide layer are two different layers, the encapsulant has an indentation exposing the top surface of the at least one of the plurality of dies, and the graphite oxide layer is disposed in the indentation.

18. The semiconductor package as claimed in claim 17, wherein the graphite oxide layer is in direct contact with the top surface of the at least one of the plurality of dies.

19. The semiconductor package as claimed in claim 17, wherein the graphite oxide layer is disposed on the top surface of each of the plurality of dies.

20. The semiconductor package as claimed in claim 17, wherein the indentation is not filled by the graphite oxide layer.

* * * * *